United States Patent [19]
Campardo et al.

[11] Patent Number: 6,075,750
[45] Date of Patent: Jun. 13, 2000

[54] METHOD AND CIRCUIT FOR GENERATING AN ATD SIGNAL TO REGULATE THE ACCESS TO A NON-VOLATILE MEMORY

[75] Inventors: Giovanni Campardo, Bergamo; Rino Micheloni, Turate; Marco Maccarrone, Palestro; Matteo Zammattio, Milan, all of Italy

[73] Assignee: STMicroelectronics S.r. l., Agrate Brianza, Italy

[21] Appl. No.: 09/186,497

[22] Filed: Nov. 4, 1998

[30] Foreign Application Priority Data

Nov. 5, 1997 [EP] European Pat. Off. ............. 97830576

[51] Int. Cl.[7] ..................................................... G11C 8/00
[52] U.S. Cl. .................................. 365/233.5; 365/189.07; 327/31; 327/36
[58] Field of Search ........................... 365/233.5, 189.07; 327/31, 36

[56] References Cited

U.S. PATENT DOCUMENTS

| | | | |
|---|---|---|---|
| 4,800,304 | 1/1989 | Takeuchi | 307/602 |
| 5,301,165 | 4/1994 | Ciraula et al. | 365/233.5 |
| 5,404,334 | 4/1995 | Pascucci et al. | 365/210 |
| 5,434,824 | 7/1995 | Matsuzaki | 365/233.5 |
| 5,448,529 | 9/1995 | Reddy et al. | 365/233.5 |
| 5,657,269 | 8/1997 | Nanamiya | 365/185.17 |
| 5,757,718 | 5/1998 | Suzuki | 365/233.5 |
| 5,886,949 | 3/1999 | Villa et al. | 365/233.5 |

FOREIGN PATENT DOCUMENTS 0 526 433 A2  2/1993  European Pat. Off. .

*Primary Examiner*—David Nelms
*Assistant Examiner*—Gene N. Auduong
*Attorney, Agent, or Firm*—Theodore E. Galanthay; Robert Iannucci; Seed IP Law Group PLLC

[57] ABSTRACT

A method and a circuit generate a pulse synchronization signal (ATD) for timing the memory cell read phase in semiconductor integrated electronic memory devices. The pulse signal (ATD) is generated upon detection of a change in logic state of at least one of a plurality of address input terminals of the memory cells. The method consists of duplicating the ATD signal into at least one pair of signals and propagating such signals through separate parallel timing chains at the ends of which the ATD signal is reinstated, the chains being alternately active.

23 Claims, 7 Drawing Sheets

METHOD AND CIRCUIT FOR GENERATING AN ATD SIGNAL TO REGULATE THE ACCESS TO A NON-VOLATILE MEMORY

TECHNICAL FIELD

This invention relates to a method and a circuit for generating an ATD pulse synchronization signal for timing the read phase of non-volatile memory cells in electronic memory devices integrated in a semiconductor.

In particular, the invention relates to a circuit generating a pulse synchronization signal for timing the read phase of memory cells in electronic memory devices integrated in a semiconductor, being of a type which is operated by a change in logic state of at least one of a plurality of address input terminals of said memory cells.

BACKGROUND OF THE INVENTION

As is well known, the read mode whereby the contents of the cells of a semiconductor integrated electronic memory circuit are read is made possible by a predetermined sequence of operations known in the art as the read cycle. A read cycle begins with a memory address of data to be read being presented to the input terminals of a memory circuit. An input stage detects the switching of an address presented to these terminals, thereby to initiate a reading operation. Row and column decoding circuits then select the memory word that has been addressed.

The circuit portion arranged to read the contents of the memory cells and convert the analog data read to digital data is known as the sense or read amplifier. This amplifier usually is of the differential type and has a pair of inputs which are connected, the one to a cell of the memory matrix and the other to a reference cell. Reading is enabled by an unbalance between the loads of the matrix leg and the reference leg.

The data sensed by the sense amplifier is then output through an output buffer stage.

Each of the above phases of a reading cycle must have a preset duration consistent with the memory access times provided by the memory circuit specifications.

All of the various phases of a reading cycle are clocked by synchronization pulses derived from a single main or ATD (Address Transition Detection) pulse. The ATD pulse is generated within the memory circuit whenever a change in address is detected on the input terminals.

In general, the ATD pulse is generated by a NOR structure whose output is at a normally high logic level. Upon the occurrence of a change in logic level at even one only of the input terminals, the NOR structure switches its output to allow a terminal from which the ATD pulse is picked up to be discharged toward ground. Shown schematically in the accompanying FIG. 1 is circuitry for generating the ATD signal as provided in the prior art.

FIG. 1 shows an ATD cell or circuitry 11 comprising two N-channel MOS input transistors, indicated at M1 and M2, which are highly conductive because sized to have a high W/L ratio.

The cell 1 farther comprises a pair of inverters 11, 12, each including a CMOS complementary pair comprising a pull-up transistor and a pull-down transistor. The pull-up transistors of the inverters 11, 12 are highly resistive, and therefore little conductive, they being sized with a reduced W/L ratio.

The structure resulting from the coupling of the inverters 11 and 12 is that of a latch register 3 having outputs Q and Q#, whereof the former, Q, is at a normally high logic level.

The latch 3 is input a signal AX and the corresponding negated signal AX_N, through one of said input terminals, as smoothed by means of capacitors C1 and C2. These signals are enabled to pass on to the latch 3 by the respective NMOS transistors M1 and M2.

During the wait phase, only one of the input signals will be at a high logic value, e.g., AX_N. The capacitor C2 will be discharged, while the capacitor C1 can be charged by the pull-up of the first inverter 11.

Upon the occurrence of an input transition, the capacitor C1 of the transistor M1 is discharged rapidly, while the capacitor C2 begins to be charged by the pull-up of the second inverter 12. In consequence of this, the first output Q of the latch 3 is at once forced to a low logic level. The other output Q# will instead take a little longer to change its state because the pull-up transistors of the inverters 11, 12 are highly resistive. Thus, there will be a time period when both said outputs are at a low logic level.

Because of the outputs Q and Q# being connected directly to the respective inputs of a logic gate 13 of the NOR type, the output of the gate 13 will be forced to a high logic level, thereby allowing an NMOS transistor M3 connected to the output node 4 of the circuit 11 to be turned on.

Associated with each address input terminal of the memory circuit is a cell 11, as shown schematically in FIG. 2.

This approach, in the art referred to as the distributed NOR, provides, for each cell, an output connected to a single ATD-LINE line 7 which is usually in the form of a metallization line taken to the supply Vdd through a transistor M4 having its control terminal connected to a ground GND.

An ATD pulse is delivered from this line 7 through an inverter 5.

Each ATD cell 11 can bias the line 7 to ground on the occurrence of an input transition. This line 7 being relatively long, it exhibits resistance and intrinsic capacitance of relatively high values, and if the switching involves all the addresses in parallel, the line 7 will be discharged at a very fast rate; otherwise, when the switching only affects the farthest terminal from the output node, the line 7 is discharged at a slower rate.

Accordingly, this structure has shown to be dependent on the number of addresses being switched. If the switching involves the physically remotest address terminals, then the circuit is subjected to a delay due to the long length of the metal paths. This affects the stability of the ATD pulse duration.

In practice, a different duration of the equalization period is obtained according to which of the terminals has been switched, this having an adverse effect on the memory access time for the read phase.

Thus, the ATD is generated by a transition occurring on at least one of the address input terminals, and it is the signal that will enable the read phase. In ideal conditions of operation, the addresses are either presented to the memory device pins simultaneously, or they are modified with a time interval not shorter than the access time, as illustrated by the graphs in FIG. 3, for example.

Unfortunately, there are no specifications to ensure that the user will take such precautions.

The non-volatile memory device shares a bus 8 of connection to a microprocessor $\mu P$ with other RAM, A/D, display, etc. peripherals. FIG. 4 shows schematically the connections between the microprocessor and the various peripherals.

When the microprocessor μP is to be communicated to the A/D converter, electric signals are issued or received on the bus 8. Only the signal CE (Chip Enable) is enabled, and in this example, only the signal CE pertaining to the converter, namely the signal CE3#, will be active.

Where the microprocessor is instead to access the flash memory, there is no specification to provide a timing "protocol" for assigning the various signals. Accordingly, the microprocessor will disable A/D and enable the flash memory using the chip enable signals CE1# and CE3#. Thereafter, the microprocessor will begin to send data on the bus 8, but during the time interval between the activation of CE1# and the issuing of the addresses by the microprocessor on the bus, the bus 8 remains charged at the values it had before, and the non-volatile memory will mistake these residual spurious logic values for data addresses and set to work by activating the ATD signal, the timing chain, etc.

In the instance of a fully static memory, that is a memory with no precharged nodes, this is quite straightforward because the stream of signals, from the addresses to the outputs, behaves like a stream of signals in combinational logic. On the other hand, where precharged nodes are provided, proper operation depends on a strict observance of the timing.

Consider, for example, a memory which utilizes a boosted supply to the word line for the read phase. To make full use of the boost effect, this should take place with the word line already at a value close to the supply voltage Vcc.

The boost phase timing is vitally important to the operation of the memory device, and a dedicated timing circuit, shown diagramatically in FIG. 5, is provided specially for this. Each time that an address transition occurs, as revealed by the ATD signal, the circuit executes the decoding of a dummy row located at the edges of the memory matrix and having the same capacitive parameters as the normally used rows.

This operation is effective to sense the time when the voltage of the selected row reaches the value of the supply Vcc. The comparator triggering value is a compromise between the voltage value that can be attained and the time taken to attain it.

If the microprocessor sends out the valid addresses before a previous reading is completed, a new ATD signal is generated. However, the timing chain will still be engaged by the previous reading, and the boost cannot be restarted correctly. In addition, should a second reading be started while the boost capacitor is yet to be recharged to the value of the supply Vcc, a positive result is obtained all the same, but the final boost voltage would be lower and, therefore, the voltage boosted node would be even lower at the end of the second read phase.

In essence, after a few read cycles, the voltage value on the word line will be insufficient to ensure proper operation. It is important, in fact, that several successive readings be verified, rather than a single reading, in order for the repositioning of the nodes to be checked at the end of each phase.

The user is, of course, authorized to change at will and at any time the addresses of the memory locations to be accessed; the last address will be the valid one, that is the address to which the memory device is definitely to output the data, e.g., as shown in FIG. 6. But, since it is impossible to know in advance which address comes last based on current specifications, the device is to be ready at each address transition because any of them could be the last.

SUMMARY OF THE INVENTION

An embodiment of this invention provides a method and a circuit for managing the ATD signal pulse, which method and circuit have such respective functional and structural features as to detect each address change and suitably drive the circuitry which manages the dynamic operation of the memory device. This would allow the drawbacks which are besetting the solutions according to the prior art to be overcome.

The embodiment uses two parallel timing chains alternately to ultimately produce a single ATD signal for use by the whole memory circuitry.

The features and advantages of the method and the circuit of this invention will be apparent from the following description of embodiments thereof, given by way of non-limitative examples with reference to the accompanying drawings.

DETAILED DESCRIPTION OF THE INVENTION

Figure 1:
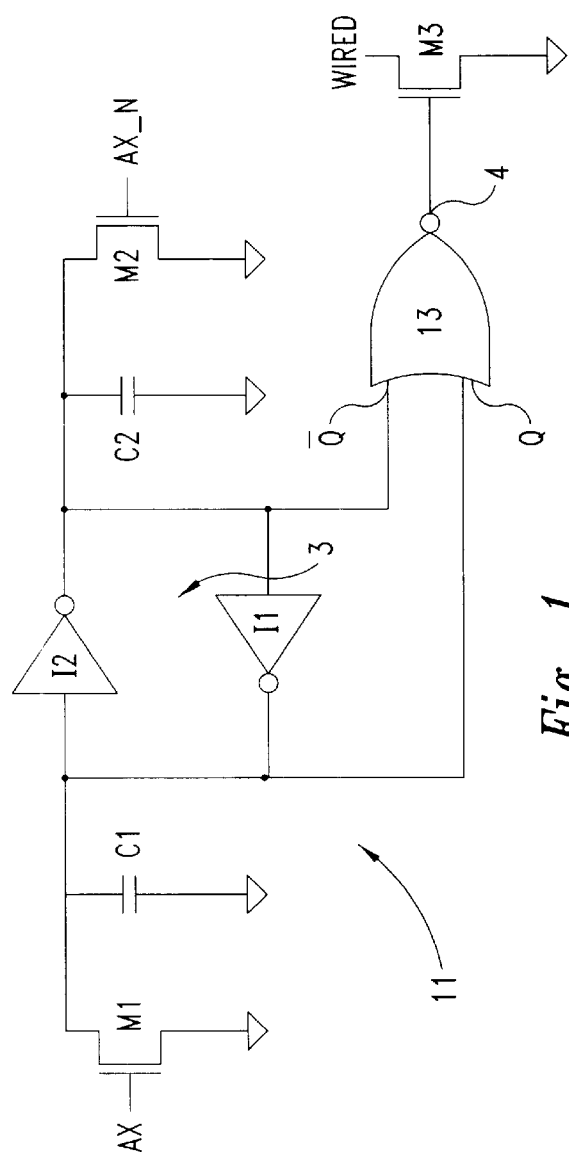
FIG. 1 shows schematically a circuit for generating a pulse ATD signal, according to the prior art.
Figure 2:
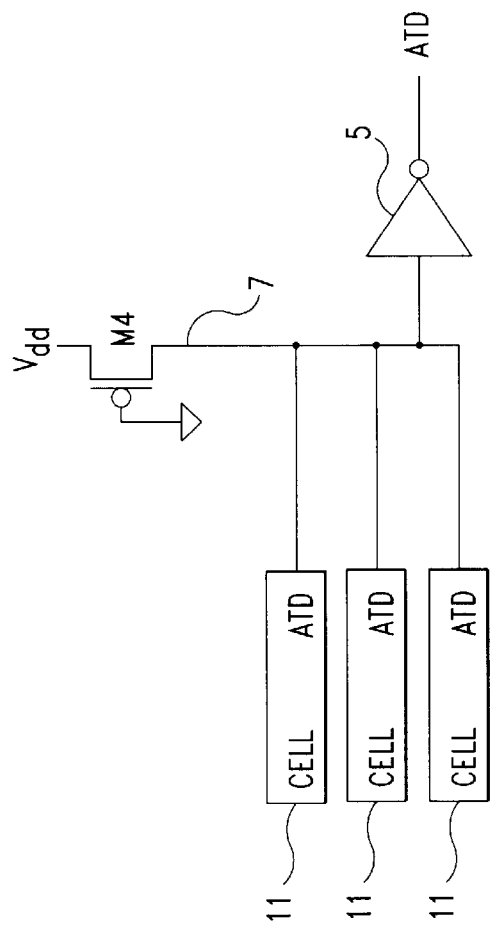
FIG. 2 shows schematically a set of circuits as in FIG. 1, connected into a distributed NOR structure for generating an ATD signal.
Figure 3:
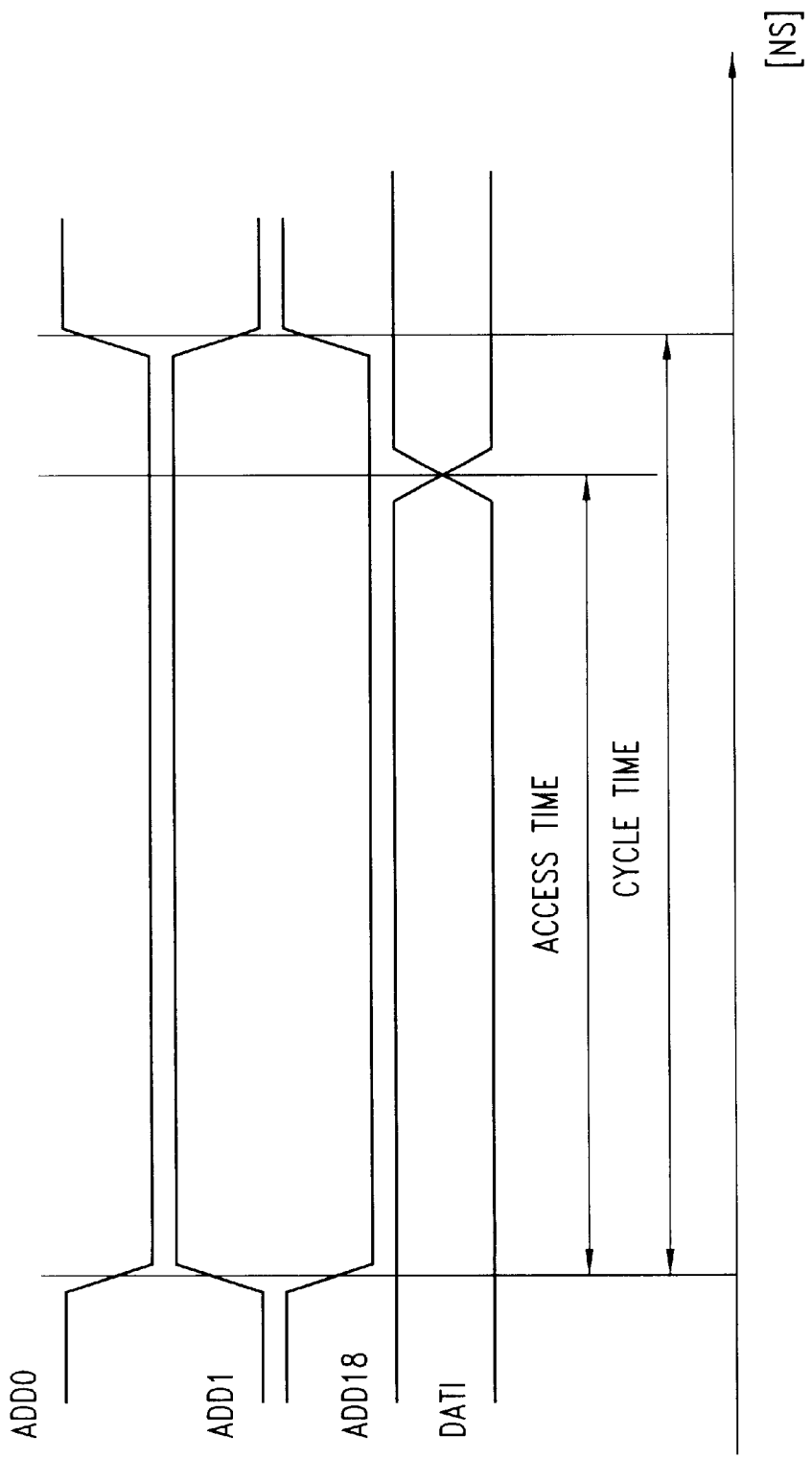
FIG. 3 is a plot of a set of address transition signals on the same time base.
Figure 4:
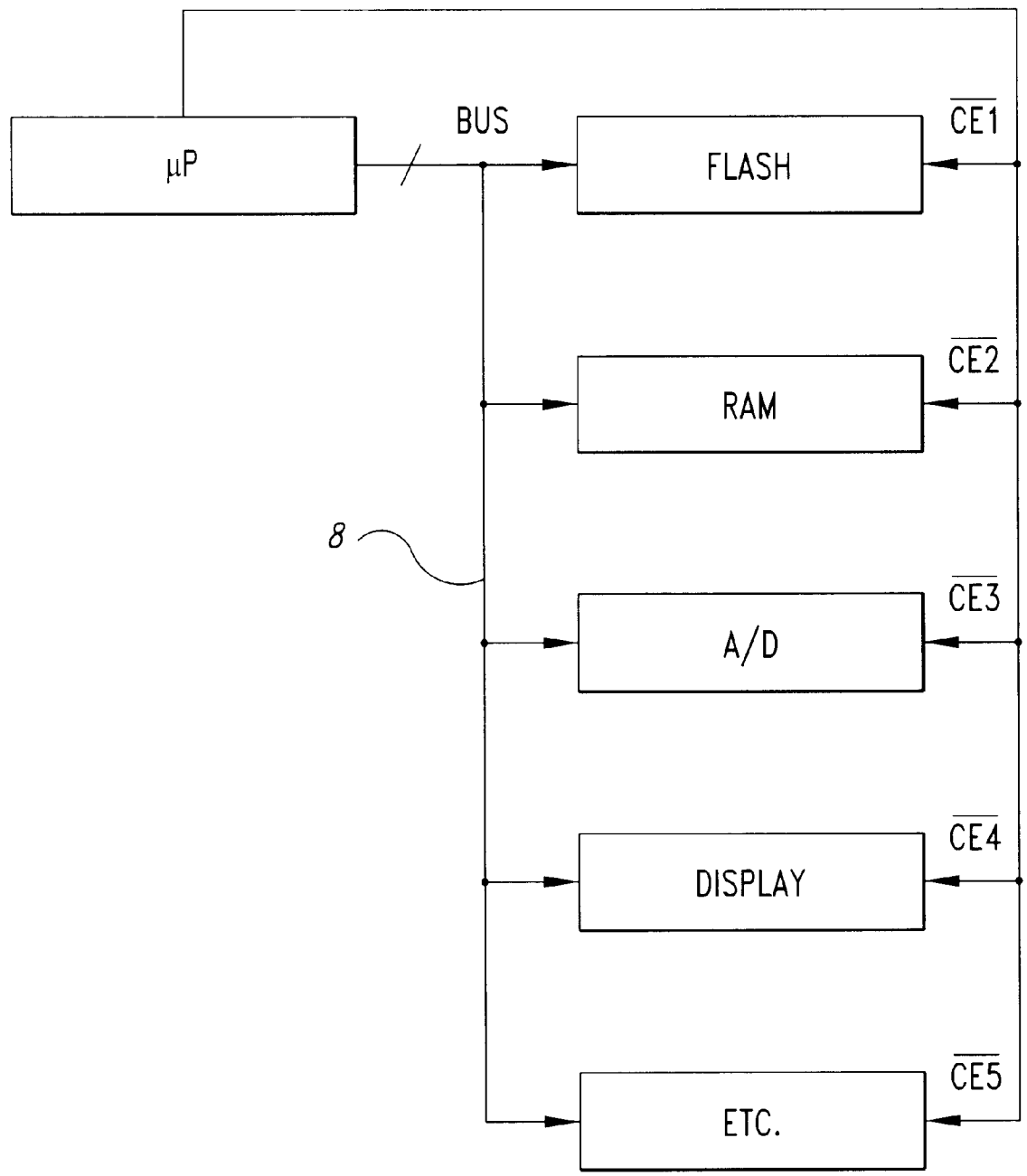
FIG. 4 shows schematically a set of electronic devices driven from a microprocessor.
Figure 5:
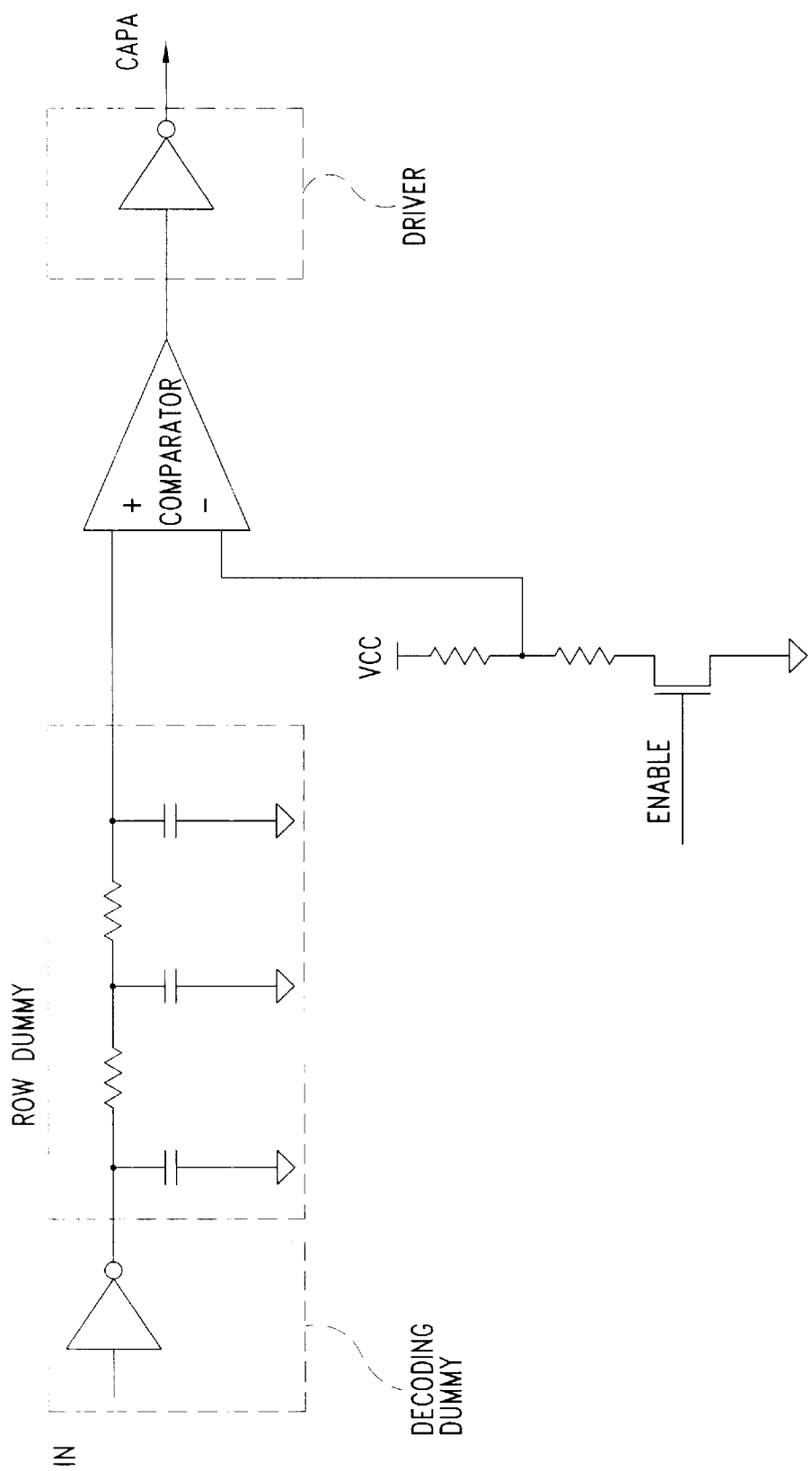
FIG. 5 shows schematically a timing circuit portion for the boost phase in an electronic memory device.
Figure 6:
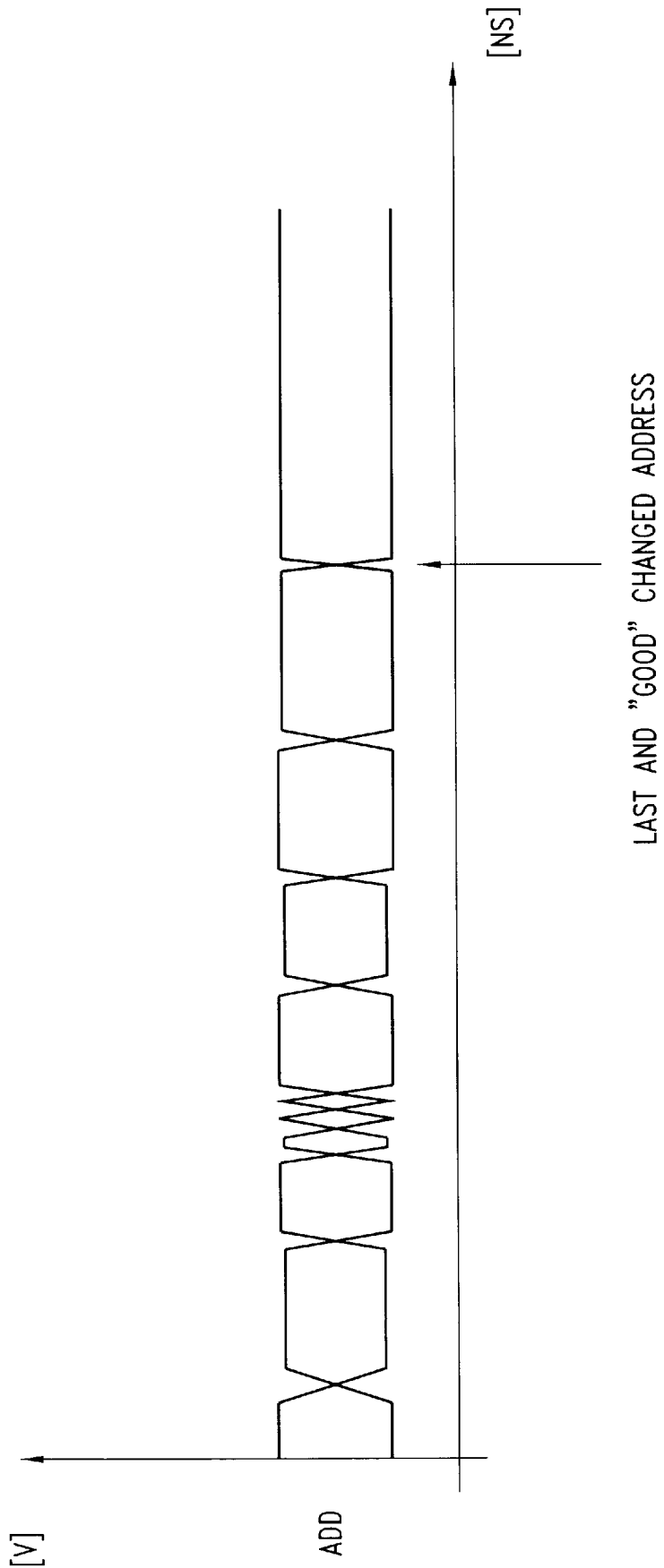
FIG. 6 shows a voltage (V) vs. time (ns) plot of a temporary sequence of address transitions before the last valid address.
Figure 7:
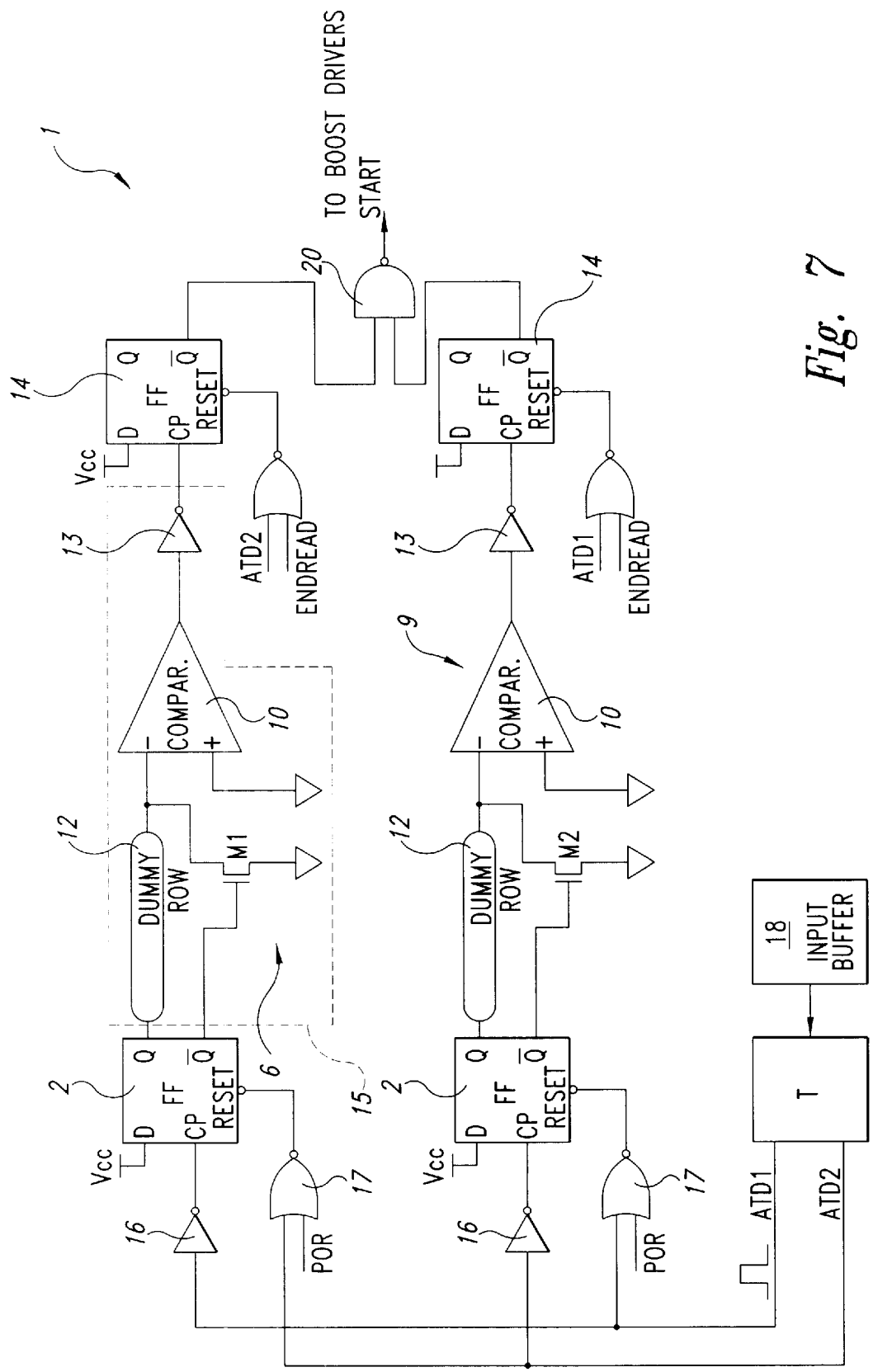
FIG. 7 shows schematically a circuit according to the invention.

Referring to the drawing views, in particular to the example of FIG. 7, generally and schematically shown at 1 is a circuit of this invention for generating an ATD (Address Transition Detection) signal to be used during a memory cell read cycle.

The expression "memory cells" is used here to indicate a plurality of memory elements incorporated to a conventional semiconductor integrated electronic device which is formed with a matrix of cells organized into rows and columns. Associated with the matrix are corresponding row and column decoding circuit portions and sense amplifiers.

These circuit components are powered between a first supply voltage reference Vcc and a second voltage reference GND.

The memory cells may be of a type whichever, with those of the non-volatile type being preferred.

The circuit 1 comprises a block T generating a first ATD signal ATD 1 and a second ATD signal ATD2. The block T is controlled from an input buffer 18 which would detect a transition on the address terminals.

In addition, the circuit 1 is advantageously formed with two parallel timing chains having respective outputs connected to a logic gate for reinstating a single signal START which would initiate and enable operations to be performed downstream, such as the boost or equalization operations.

A first memory element 2 and a comparison central portion 15 are connected to the input end of the first timing chain 6, whose output end is connected to a second memory element 14.

The first and second memory elements, 2 and 14, are bistable flip-flops of the DT type having a first input D, an input RESET, and a timing input CP.

The input D of the first memory element 2 is connected to the supply Vcc. The timing input CP of the first element 2 receives the first signal ATD1 via an inverter 16. The input RESET receives the other signal ATD2 via a two-input logic gate 17, which gate receives a memory device reset signal POR on the other input. The memory element 2 has a first output Q connected to a peripheral dummy row 12 of the memory matrix.

The memory element 2 also has a second output $\overline{Q}$ connected to the control terminal of an NMOS discharge transistor M1 having its source terminal connected to ground GND and its drain terminal connected to the end of the dummy row 12.

The dummy row 12 and transistor M1 are included in the central portion 15 of the first timing chain 6, along with a comparator 10 and an inverter 13.

The comparator 10 has an input connected to a voltage reference and a second input connected to the end of the dummy row 12 and, hence, to the drain terminal of the transistor M1. The output of the comparator 10 is connected to the timing input CP of the second memory element 14 through the inverter 13. This output goes from high to low upon the threshold of the comparator 10 being exceeded.

The input D of the second memory element 14 is also connected to the supply Vcc, while the input RESET receives the second ATD signal via a two-input NOR logic gate, which gate receives an end of reading control signal ENDREAD on the other input. The ATD signal applied to the element 14 originates from a NOR operation carried out on the signals ATD1 and ATD2.

The negated output $\overline{Q}$ from the second memory element 14 is applied to a first input of a two-input NAND logic gate 20. The output from this gate 20 indeed represents the signal used for timing the access to the cells of the memory device.

Advantageously, the circuit 1 comprises a second timing chain 9 connected in parallel with the first chain 6.

The construction of the second chain 9 is identical with that of the first chain 6, except that the timing input CP of the first memory element 2 receives here the second signal ATD2 via the inverter 16 and that the NOR logic gate associated with the input RESET of the element 2 receives the first signal ATD1. Also, the discharge transistor of the dummy row 12 is denoted by M2 in the second timing chain 9.

Figure 8:
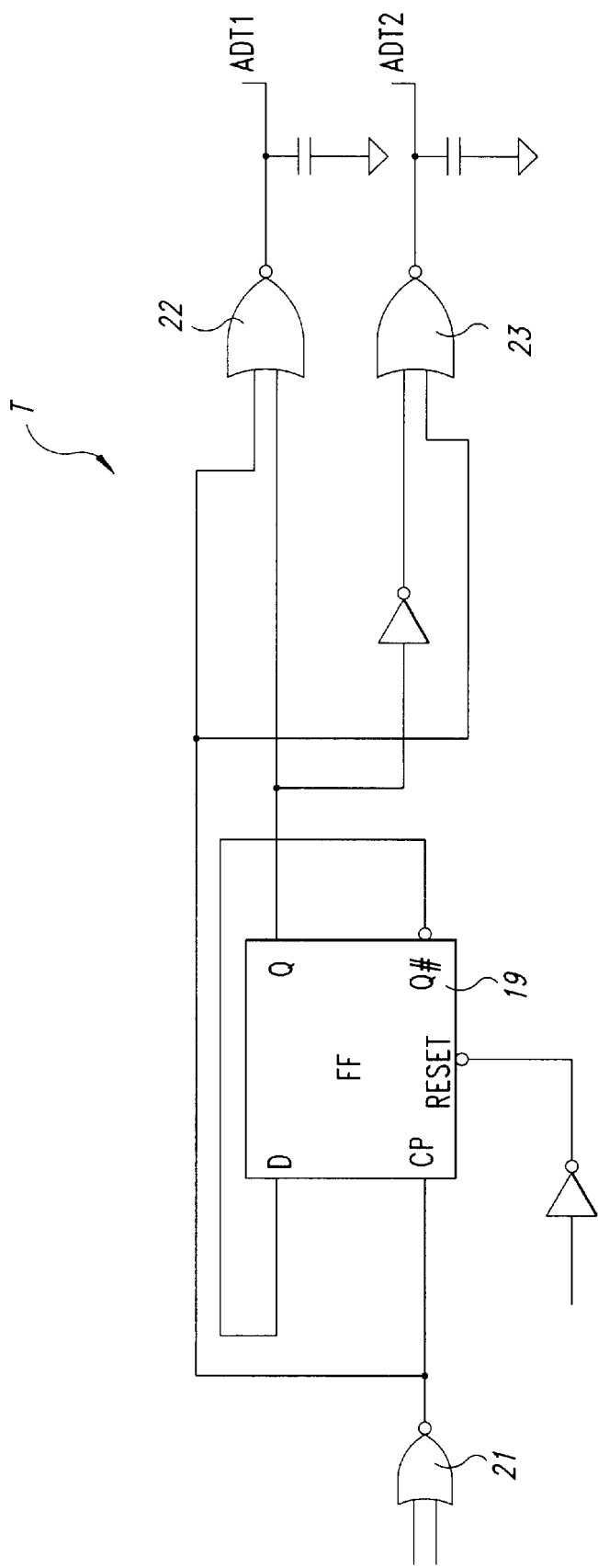
FIG. 8 shows schematically a detail of the circuit in FIG. 7.

FIG. 8 shows schematically the internal construction of the source block T which comprises basically a bistable flip-flop 19 of the DT type receiving, on the timing input CP, an ATD signal via a logic gate 21 of the NOR type.

The output from this logic gate 21 is also applied to an input of another logic gate 22 of the NOR type, which gate 22 receives the output Q from the bistable 19 on the other input. The output from this logic gate 22 produces the first signal ATD1.

The output Q of the bistable 19 is also connected to a first input of a third logic gate 23 of the NOR type through an inverter. The other input to the third gate 23 is again the output from the logic gate 21. The output from the third logic gate 23 produces the second signal ATD2.

The method of managing the ATD signal of this invention will now be described.

The circuitry in the input buffers 18 generates a first ATD signal, which is a short time duration pulse, at each address input transition.

The block T is to "route" the input signal, now to the output ATD1 and then to the output ATD2.

For proper operation of the assembly, the block T should be operated in a predictive mode. This means that during the supply voltage Vcc power-up, when the device is turned on, the block T presets for activation the conduction path toward the first signal ATD1. Upon the first signal ATD 1 being generated, the block T will turn off the path toward ATD1 and activate the second path toward the signal ATD2. In essence, the block T is ready for acquiring a new ATD pulse already from the falling edge of the first signal ATD1 and after the ATD signal has been passed. The block T has the path for the next ATD always active. The inverters 16 are unessential to the invention, and they only function to operate the circuit at the falling edge of the signal ATD1 or ATD2.

The block T is constructed as shown in FIG. 8, where the DT flip-flop clearly will change over at the falling edge of the input ATD pulse, i.e., at the pulse end.

The signals ATD1 and ATD2 are produced within the block T, stored into the memory elements 2, and then delivered through the timing chains 6 and 9 along a path which is a copy of the actual read path having the same propagation delay. The four memory elements 2 and 14 represent a "decompression chamber" on whose interior the ATD signals can propagate at any desired frequency, and never get lost thanks to the flip-flop structures provided.

The two timing chains 6, 9 originate a signal START which starts the boost when in the high state. The two chains 6 and 9 are in parallel but are operated alternately, and the outgoing signal from the circuit 1 is ultimately reinstated in the logic gate 20 such that it can be used by the whole circuitry of the memory device.

In order to speed up the dummy row 12 discharge, which can be equated to an RC circuit, the discharge transistors M1 and M2 have been inserted. In this way, the frequency can be increased with which a timing may be requested to start. In essence, the sooner the dummy row 12 is discharged, the earlier can its re-charge evaluation be re-started.

Furthermore, all the flip-flops 2, 14 use a reset signal POR to position the values of the outputs, although this operation is not strictly necessary because either signal path is always on, and therefore, always ready for operation.

The invention is useful in all those cases where a timing phase of duration T is provided, specifically in all those cases where a timing circuit having a higher frequency than that corresponding to the period T must be used.

The described embodiment of the invention solves the technical problems of the prior art by duplicating the timing circuit and alternately using either legs. When one leg is active timing-wise, the other leg is reset to its original condition in readiness for the next call.

The method and circuit of this invention do solve the technical problems of the prior art and afford a number of advantages, such as the adaptability of the ATD pulse duration for actual memory access requirements.

From the foregoing it will be appreciated that, although specific embodiments of the invention have been described herein for purposes of illustration, various modifications may be made without deviating from the spirit and scope of the invention. Accordingly, the invention Is not limited except as by the appended claims.

What is claimed is:

1. A regulating circuit for generating a pulse synchronization signal (ATD) in order to time a read phase of memory cells in semiconductor integrated electronic memory devices, being of a type which is operated by a change in logic state of at least one of a plurality of address input terminals of said memory cells, the circuit comprising at least first and second timing chains connected in parallel between an input generating block and an output logic gate, each chain being adapted to propagate a corresponding timing signal generated by said block, wherein each chain has an input connected to a first memory element of the flip-flop type having a timing input to which is applied one of said timing signals, and a reset input receiving another of said timing signals via a reset logic gate.

2. A regulating circuit according to claim 1, wherein each chain has a central portion including a dummy memory row connected to a first output of the first memory element, a comparator connected downstream of said row, and a discharge transistor having a conduction terminal connected between the row and the comparator.

3. A regulating circuit according to claim 2, wherein in each chain a second output of said first memory element is connected to a control terminal of said discharge transistor.

4. A regulating circuit according to claim 1, further comprising a second memory element, being connected to an output of one of the chains and having an output connected to an input of said output logic gate.

5. A regulating circuit according to claim 1, wherein the reset logic gates associated with the reset inputs of the first memory element in the timing chains respectively receive one of said timing signals.

6. A regulating circuit according to claim 1, wherein said generating block includes a memory element and a set of logic gates.

7. A regulating circuit for an electronic memory device, comprising:
   an input generating block having first and second output nodes and structured to produce at the first and second output nodes respective first and second timing signals from an ATD signal;
   first and second signal paths respectively coupled to the first and second output nodes of the input generating block and having respective first and second output nodes; and
   an output logic gate with first and second inputs respectively coupled to the output nodes of the signal paths;
   wherein the input generating block includes:
      a logic flip-flop having a first input coupled to the ATD signal and a first output;
      a first output logic gate having a first input coupled to the input of the logic flip-flop, a second input coupled to the first output of the logic flip-flop, and an output at which the first timing signal is produced; and
      a second output logic gate having a first input coupled to the input of the logic flip-flop, a second input coupled to the first output of the logic flip-flop through an inverter, and an output at which the second timing signal is produced.

8. The regulating circuit of claim 7 wherein the input generating block includes a logic stage that ensures that the first and second timing signals are not both active simultaneously.

9. The regulating circuit of claim 7 wherein the logic flip-flop includes a second input and a second output that are coupled to each other.

10. The regulating circuit of claim 7 wherein each of the first and second signal paths includes first and second memory elements coupled to each other by a timing chain.

11. The regulating circuit of claim 7 wherein the first signal path includes a flip-flop having a first input coupled to the first output node of the input generating block and a second input coupled to the second output node of the input generating block.

12. The regulating circuit of claim 7 wherein the first signal path includes a first flip-flop having an input node coupled to the first output node of the input generating block and a first output node and a timing chain having a first input node coupled to the first output node of the first flip-flop and an output node.

13. A regulating circuit for an electronic memory device, comprising:
   an input generating block having first and second output nodes and structured to produce at the first and second output nodes respective first and second timing signals from an ATD signal;
   first and second signal paths respectively coupled to the first and second output nodes of the input generating block and having respective first and second output nodes; and
   an output logic gate with first and second inputs respectively coupled to the output nodes of the signal paths;
   wherein the first signal path includes a first flip-flop having an input node coupled to the first output node of the input generating block and a first output node and a timing chain having a first input node coupled to the first output node of the first flip-flop and an output node; and
   wherein the first signal path also includes a second flip-flop having an input node coupled to the output node of the timing chain and an output node coupled to the output logic gate.

14. A regulating circuit for an electronic memory device, comprising:
   an input generating block having first and second output nodes and structured to produce at the first and second output nodes respective first and second timing signals from an ATD signal;
   first and second signal paths respectively coupled to the first and second output nodes of the input generating block and having respective first and second output nodes; and
   an output logic gate with first and second inputs respectively coupled to the output nodes of the signal paths;
   wherein the first signal path includes a first flip-flop having an input node coupled to the first output node of the input generating block and a first output node and a timing chain having a first input node coupled to the first output node of the first flip-flop and an output node; and
   wherein the first flip-flop includes a second output node and the timing chain includes a dummy memory row coupled to the first output node of the first flip-flop; a discharge transistor having a control terminal coupled to the second output node of the first flip-flop, a first terminal coupled to an output node of the dummy memory row, and a second terminal coupled to a voltage reference; a comparator having a first input terminal coupled to the first terminal of the discharge transistor, a second input terminal coupled to the voltage reference, and an output terminal; and an inverter coupled between the output terminal of the comparator and an output node of the timing chain.

15. The regulating circuit of claim 14 wherein the first signal path also includes a second flip-flop having an input node coupled to the output node of the timing chain and an output node coupled to the output logic gate.

16. An address transition detection circuit, comprising two timing chains connected in parallel between an input generating block and an output logic gate, each chain being adapted to propagate a corresponding timing signal generated by the input generating block, wherein each chain has an input connected to a first memory element of the flip-flop type having a timing input to which is applied one of the timing signals, and a reset input receiving another one of the timing signals via a reset logic gate.

17. The address transition detection circuit of claim 16 wherein each chain has a central portion including a dummy memory row connected to a first output of the first memory element, a comparator connected downstream of said row, and a discharge transistor having a conduction terminal connected between the row and the comparator.

18. The address transition detection circuit of claim 17, wherein in each chain a second output of said first memory element is connected to a control terminal of said discharge transistor.

19. The address transition detection circuit of claim 16, further comprising a second memory element, being connected to an output of one of the chains and having an output connected to an input of said output logic gate.

20. The address transition detection circuit of claim 16, wherein the reset logic gates associated with the reset inputs of the first memory element in the timing chains respectively receive one of said timing signals.

21. A method of generating of generating a pulse synchronization signal (ATD) for timing a memory cell read phase in a semiconductor integrated electronic memory device, the method comprising generating said ATD signal upon detection of a change in logic state of at least one of a plurality of address input terminals of memory cells of said memory device, duplicating the ATD signal into at least one pair of pulse timing signals, and propagating the pulse timing signals of said at least one pair through separated parallel timing chains at the ends whereof the ATD signal is reinstated, said chains being alternately active, the at least one pair of pulse timing signal including first and second timing signals, the first timing signal activating a first one of the parallel timing chains and deactivating a second one of the parallel timing chains, the second timing signal deactivating the first parallel timing chain and activating the second timing chain.

22. A method according to claim 21, wherein the reinstating of the ATD signal at the end of the timing chains is effected by a logic gate.

23. A method according to claim 21, wherein a first one of the pulse timing signals is activated immediately upon the device being turned on, and that a second one of the pulse timing signals is activated at a falling edge of said first pulse timing signal.

* * * * *